US010580605B2

(12) United States Patent
Tabib-Azar

(10) Patent No.: US 10,580,605 B2
(45) Date of Patent: Mar. 3, 2020

(54) VERY LOW POWER MICROELECTROMECHANICAL DEVICES FOR THE INTERNET OF EVERYTHING

(71) Applicant: University of Utah Research Foundation, Salt Lake City, UT (US)

(72) Inventor: Massood Tabib-Azar, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 562 days.

(21) Appl. No.: 15/360,508

(22) Filed: Nov. 23, 2016

(65) Prior Publication Data

US 2017/0148592 A1 May 25, 2017

Related U.S. Application Data

(60) Provisional application No. 62/258,898, filed on Nov. 23, 2015.

(51) Int. Cl.
*H01L 41/08* (2006.01)
*H02N 2/18* (2006.01)
(Continued)

(52) U.S. Cl.
CPC ......... *H01H 57/00* (2013.01); *H01L 41/1132* (2013.01); *H01L 41/1136* (2013.01);
(Continued)

(58) Field of Classification Search
CPC ................. H01H 57/00; H01H 59/009; H01H 2057/006; H01H 2059/0072;
(Continued)

(56) References Cited

U.S. PATENT DOCUMENTS 4,594,898 A 6/1986 Kirman et al.
4,658,175 A 4/1987 Albert
(Continued)

FOREIGN PATENT DOCUMENTS

EP 2355342 A2 * 8/2011 ............... H03H 9/10

OTHER PUBLICATIONS

Lang et al., Cantilever Array Sensors, Materials Today, vol. 8, Issue 4, Apr. 2005, 30-36.
(Continued)

*Primary Examiner* — Thomas M Dougherty
(74) *Attorney, Agent, or Firm* — Thorpe North & Western, LLP

(57) ABSTRACT

A microelectromechanical device is disclosed and described. The microelectromechanical device can include a base having a raised support structure. The microelectromechanical device can also include a biasing electrode supported by the base. The microelectromechanical device can further include a displacement member supported by the raised support structure. The displacement member can have a movable portion extending from the raised support structure and spaced from the biasing electrode by a gap. The movable portion can be movable relative to the base by deflection of the displacement member. The displacement member can also have a piezoelectric material associated with the movable portion. In addition, the microelectromechanical device can include a voltage source electrically coupled to the piezoelectric material and the biasing electrode. The voltage source can apply a biasing voltage to the piezoelectric material and the biasing electrode to cause deflection of the displacement member toward the biasing electrode, thereby reducing the gap between the movable portion and the biasing electrode. Further deflection of the displacement member can cause an increase in voltage across the piezo-
(Continued)

electric material and the biasing electrode sufficient to pull the movable portion into contact with the biasing electrode.

27 Claims, 10 Drawing Sheets

(51) Int. Cl.
    *H01H 57/00*     (2006.01)
    *H01L 41/113*     (2006.01)
    *H01H 59/00*     (2006.01)
    *G01P 15/08*     (2006.01)

(52) U.S. Cl.
    CPC ............ *H02N 2/186* (2013.01); *H02N 2/188* (2013.01); *G01P 15/0802* (2013.01); *G01P 2015/0828* (2013.01); *G01P 2015/0831* (2013.01); *H01H 59/0009* (2013.01); *H01H 2057/006* (2013.01); *H01H 2059/0072* (2013.01)

(58) Field of Classification Search
    CPC .......... B81B 3/0037; B81B 2201/0214; B81B 2201/0278; B81B 2201/0285; B81B 2201/0292; B81B 2203/0118; B81B 2203/0127; B81B 2203/04
    USPC ................. 310/311, 324, 328, 348, 365, 367
    See application file for complete search history.

(56) References Cited

U.S. PATENT DOCUMENTS

| | | | |
|---|---|---|---|
| 4,893,048 A * | 1/1990 | Farrall ................. | H01H 1/2066 200/181 |
| 4,947,694 A | 8/1990 | Kirman et al. | |
| 4,951,510 A | 8/1990 | Holm-Kennedy et al. | |
| 5,020,370 A | 6/1991 | Deval et al. | |
| 5,036,715 A | 8/1991 | Hanson | |
| RE33,691 E * | 9/1991 | Harnden, Jr. .......... | H01H 57/00 200/181 |
| 5,209,117 A | 5/1993 | Bennett | |
| 5,275,055 A | 1/1994 | Zook et al. | |
| 5,386,720 A | 2/1995 | Toda et al. | |
| 5,417,115 A | 5/1995 | Burns | |
| 5,578,766 A | 11/1996 | Kondo | |
| 5,596,194 A | 1/1997 | Kubena et al. | |
| 5,729,075 A | 3/1998 | Strain | |
| 5,739,686 A | 4/1998 | Naughton et al. | |
| 6,073,484 A | 6/2000 | Miller et al. | |
| 6,237,399 B1 | 5/2001 | Shivaram et al. | |
| 6,377,438 B1 * | 4/2002 | Deane ...................... | H01G 5/18 361/277 |
| 6,887,365 B2 | 5/2005 | Naughton | |
| 7,112,911 B2 * | 9/2006 | Tanaka ................... | H02N 1/006 290/1 R |
| 7,148,579 B2 | 12/2006 | Pinkerton et al. | |
| 8,497,672 B2 | 7/2013 | Kawakubo et al. | |
| 8,887,582 B2 | 11/2014 | Suzuki | |
| 2006/0227489 A1 * | 10/2006 | Bunyan .................. | H01H 57/00 361/160 |
| 2007/0080765 A1 * | 4/2007 | Lee .......................... | H01P 1/127 335/78 |
| 2010/0207697 A1 * | 8/2010 | Sayama ................... | H03H 3/02 331/158 |
| 2011/0148255 A1 * | 6/2011 | Nihei ..................... | H01H 57/00 310/330 |
| 2011/0193643 A1 * | 8/2011 | Tange ................. | H03H 9/1021 331/158 |
| 2017/0066645 A1 * | 3/2017 | Brewer ................ | B81B 3/0027 |

OTHER PUBLICATIONS

Kumar et al., Active Vibration Control of Smart Piezo Cantilever Beam Using PID Controller, International Journal of Research in Engineering and Technology, vol. 3. Issue 1, Jan. 2014, 392-399.

* cited by examiner

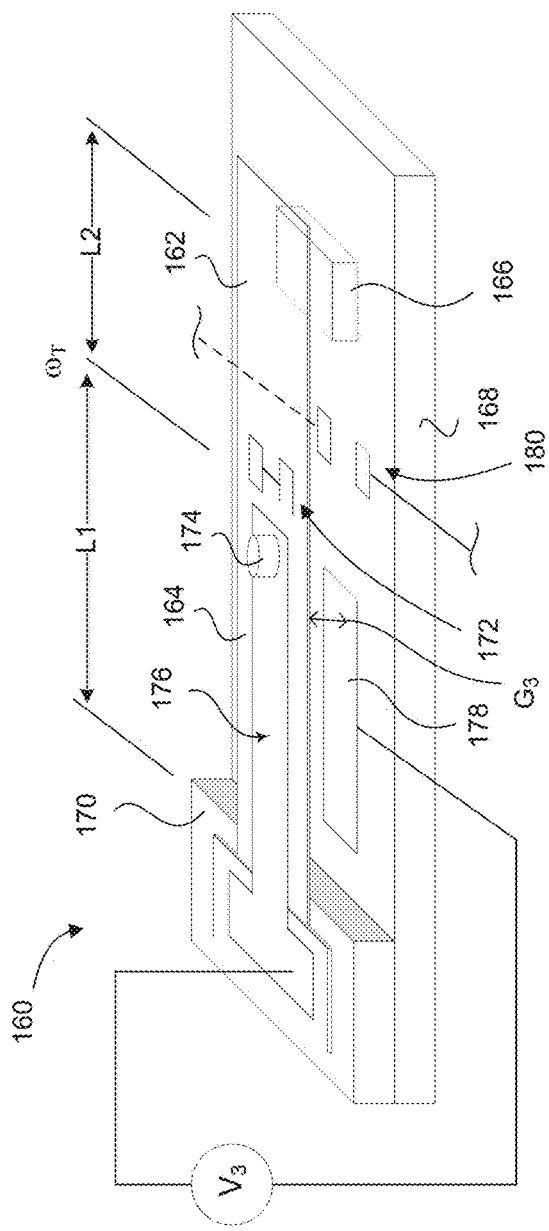
FIG. 5
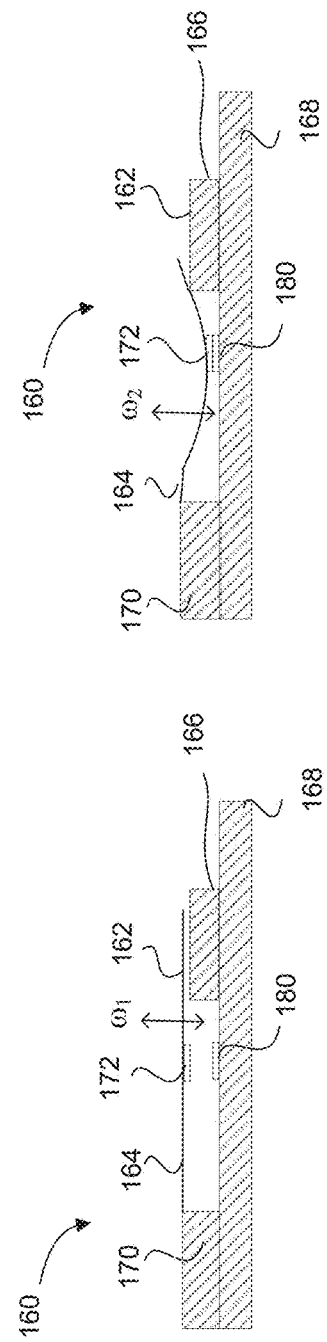
FIG. 6A
FIG. 6B

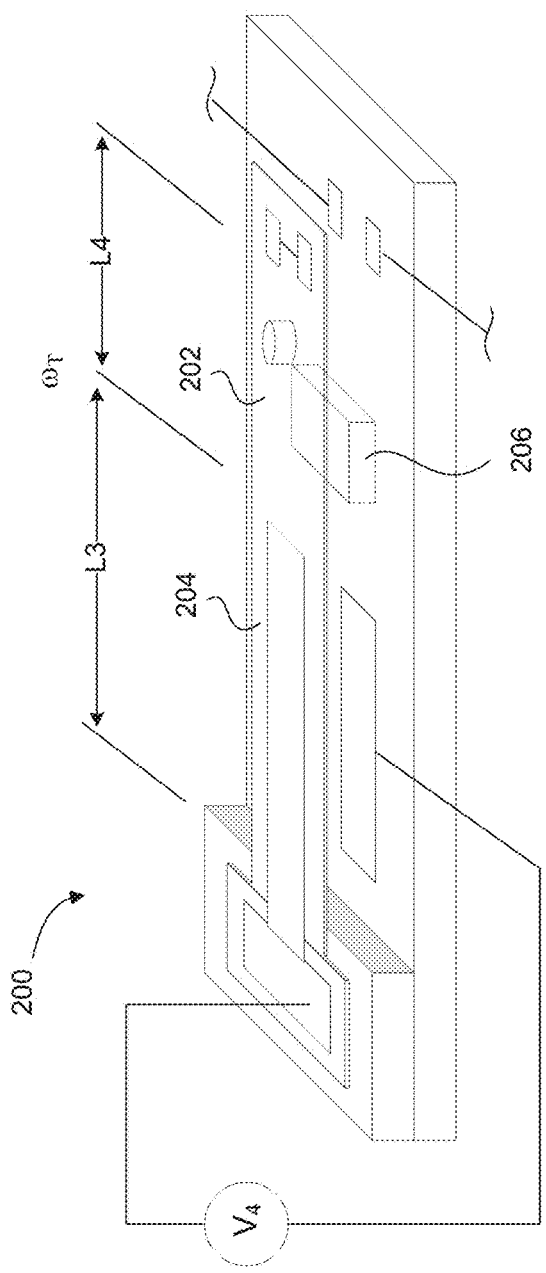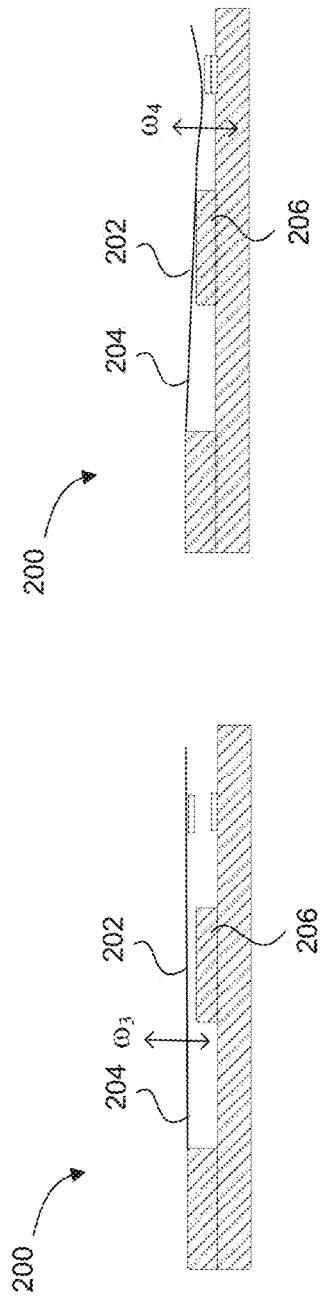

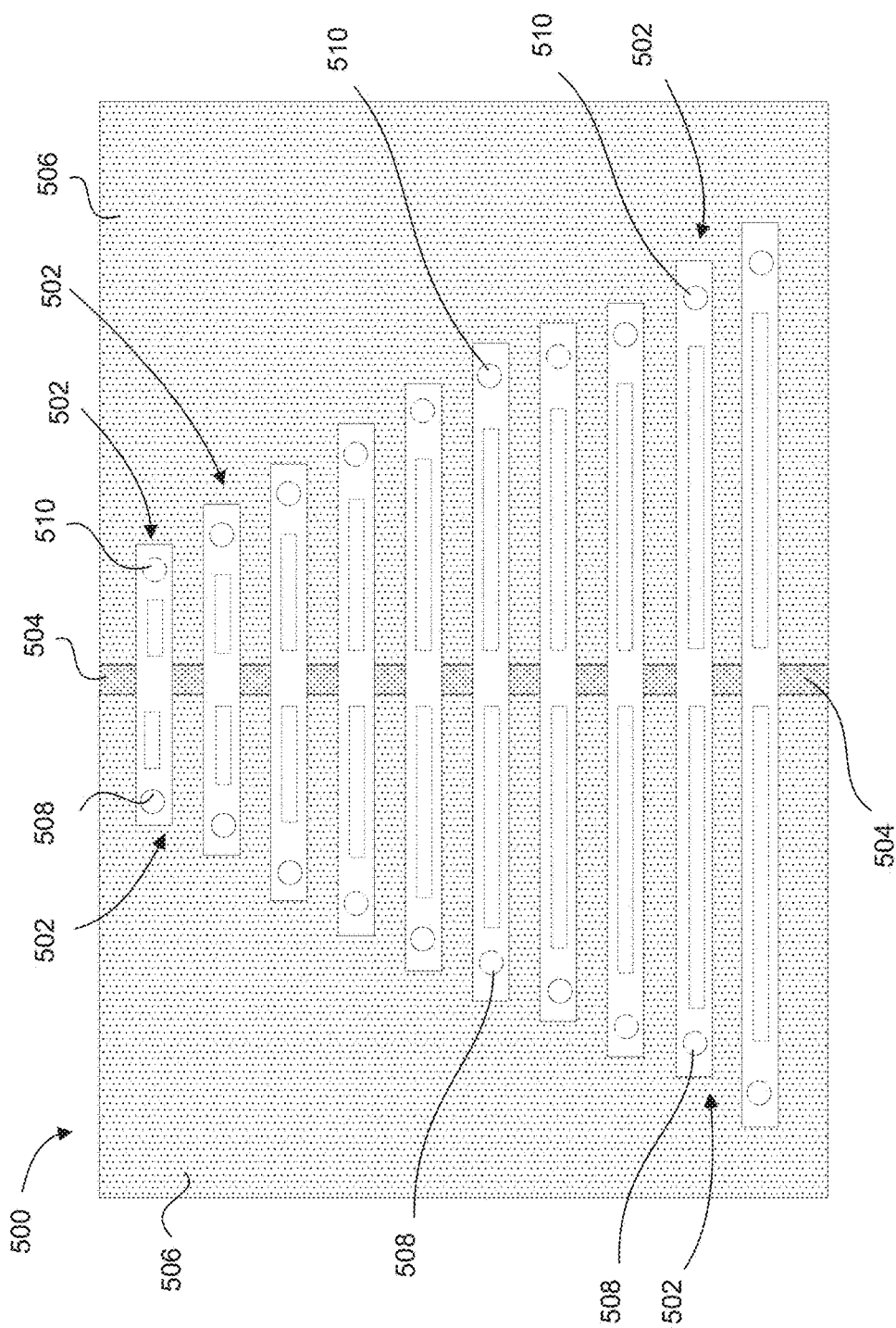

VERY LOW POWER MICROELECTROMECHANICAL DEVICES FOR THE INTERNET OF EVERYTHING

RELATED APPLICATION(S)

This application claims priority to U.S. Provisional Application No. 62/258,898, filed Nov. 23, 2015, which is incorporated herein by reference.

GOVERNMENT INTEREST

This invention was made with government support under Grant No. ECCS1419836 awarded by the National Science Foundation. The government has certain rights in the invention.

BACKGROUND

Sensors are used in a wide variety of applications, including monitoring the environment, medical diagnostics, contraband detection, chemical process metrology, hazardous substance detection, and any process where the detection or measurement of a substance or energy source is necessary. Some sensors utilize cantilevered beams which are used to sense force, torque, etc. Sensors based on micro-mechanical devices have very small stand-by power consumption and are good candidates for the emerging Internet of Everything (IoE) where multitude of sensors are required to monitor status of every appliance, device, system and their environment.

SUMMARY

A microelectromechanical device is disclosed herein that can include a base having a raised support structure. The microelectromechanical device can also include an optional biasing electrode supported by the base. The microelectromechanical device can further include a displacement member supported by the raised support structure. The displacement member can have a movable portion extending from the raised support structure and spaced from the biasing electrode by a gap. The movable portion can be movable relative to the base by deflection of the displacement member. The displacement member can also have a piezoelectric material associated with the movable portion. In addition, the microelectromechanical device can include a voltage source electrically coupled to the movable part and the biasing electrode. The voltage source can apply a biasing voltage to the movable portion and the biasing electrode to cause its deflection (displacement) toward the biasing electrode, thereby reducing the gap between the movable portion and the biasing electrode. This enables the movable part to respond (deflect) more sensitively when subjected to external mechanical excitations, magnetic variations, electric charge variations, thermal variations, or any other environmental parameter or signal of interest. Further deflection of the displacement member can cause an increase in the charge across the deformable member and the biasing electrode sufficient to pull the movable portion into contact with the biasing electrode. The piezoelectric layer can be used to harvest energy from the vibration of the movable portion in response to the environment or the signal that is being sensed. The voltage across the piezoelectric layer can also be used to feed the subsequent stages of the circuit to perform computations on the sensed signals.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

BRIEF DESCRIPTION OF THE DRAWINGS

FIG. 5 illustrates a microelectromechanical device in accordance with yet another example of the present disclosure.

FIGS. 6A and 6B are side views of the microelectromechanical device of FIG. 5 under differing flexure positions.

FIG. 7 illustrates a microelectromechanical device in accordance with still another example of the present disclosure.

FIGS. 8A and 8B are side views of the microelectromechanical device of FIG. 5 under differing flexure positions.

FIG. 15 illustrates a microelectromechanical device in accordance with another example of the present disclosure.

Figure 1:
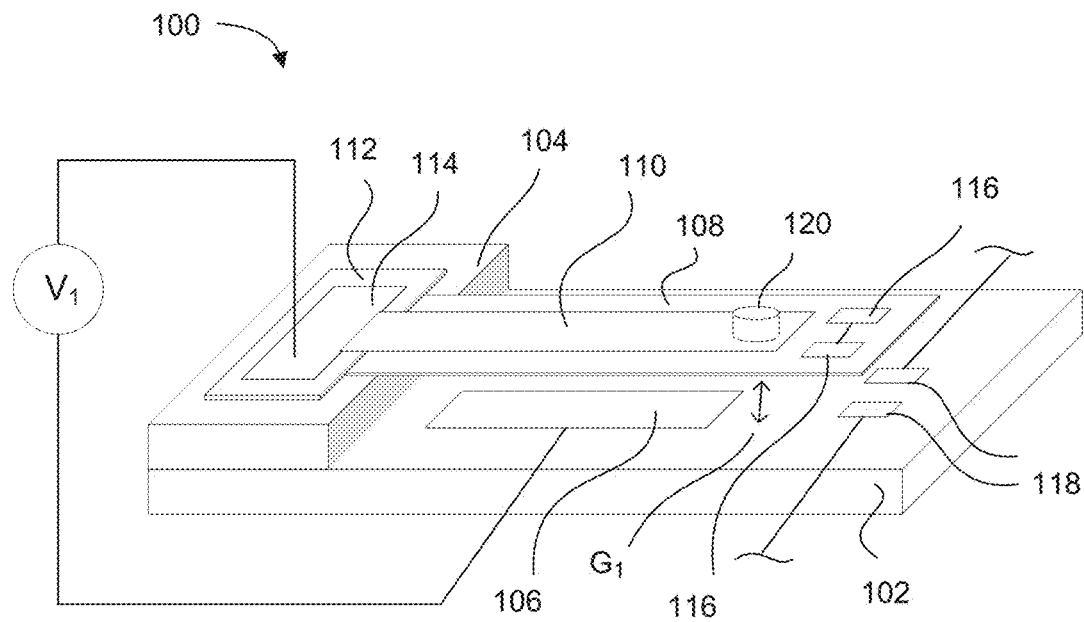
FIG. 1 illustrates a microelectromechanical device in accordance with an example of the present disclosure. Notably, the cantilevered beam (one side clamped) can optionally be replaced with a bridge (double side clamped), or other suitable flexure structure such as a diaphragm or a plate.

These drawings are provided to illustrate various aspects of the invention and are not intended to be limiting of the scope in terms of dimensions, materials, configurations, arrangements or proportions unless otherwise limited by the claims.

DETAILED DESCRIPTION

While these exemplary embodiments are described in sufficient detail to enable those skilled in the art to practice the invention, it should be understood that other embodiments may be realized and that various changes to the invention may be made without departing from the spirit and scope of the present invention. Thus, the following more detailed description of the embodiments of the present invention is not intended to limit the scope of the invention, as claimed, but is presented for purposes of illustration only and not limitation to describe the features and characteristics of the present invention, to set forth the best mode of operation of the invention, and to sufficiently enable one skilled in the art to practice the invention. Accordingly, the scope of the present invention is to be defined solely by the appended claims.

Definitions

In describing and claiming the present invention, the following terminology will be used.

The singular forms "a," "an," and "the" include plural referents unless the context clearly dictates otherwise. Thus, for example, reference to "a displacement member" includes reference to one or more of such features.

As used herein with respect to an identified property or circumstance, "substantially" refers to a degree of deviation that is sufficiently small so as to not measurably detract from the identified property or circumstance. The exact degree of deviation allowable may in some cases depend on the specific context.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

As used herein, the term "at least one of" is intended to be synonymous with "one or more of." For example, "at least one of A, B and C" explicitly includes only A, only B, only C, or combinations of each.

Numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a numerical range of about 1 to about 4.5 should be interpreted to include not only the explicitly recited limits of 1 to about 4.5, but also to include individual numerals such as 2, 3, 4, and sub-ranges such as 1 to 3, 2 to 4, etc. The same principle applies to ranges reciting only one numerical value, such as "less than about 4.5," which should be interpreted to include all of the above-recited values and ranges. Further, such an interpretation should apply regardless of the breadth of the range or the characteristic being described.

Any steps recited in any method or process claims may be executed in any order and are not limited to the order presented in the claims. Means-plus-function or step-plus-function limitations will only be employed where for a specific claim limitation all of the following conditions are present in that limitation: a) "means for" or "step for" is expressly recited; and b) a corresponding function is expressly recited. The structure, material or acts that support the means-plus function are expressly recited in the description herein. Accordingly, the scope of the invention should be determined solely by the appended claims and their legal equivalents, rather than by the descriptions and examples given herein.

Microelectromechanical Device

With reference to FIG. 1, a microelectromechanical device 100 is illustrated in accordance with an example of the present disclosure. The microelectromechanical device 100 can include a base 102 having a raised support structure 104, both of which can be comprised of a dielectric/structural material, such silicon, glass, polysilicon, silicon dioxide, aluminum oxide, silicon nitride, and other structural/dielectric materials. The microelectromechanical device 100 can also include a biasing electrode 106 supported by the base 102. Notably, a biasing electrode and/or bias voltage can be optional. The microelectromechanical device 100 can further include a displacement member 108 supported by the raised support structure 104. The displacement member 108 can act as a cantilever beam extending from the raised support structure 104 and spatially separate from the base 102 (when in a normal position, as in FIG. 1).

The displacement member 108 can have a movable portion 110 associated with the raised support structure 104 and spaced from the biasing electrode 106 by a gap $G_1$. A dielectric component 112 can be supported by the raised support structure 104 and a conductive component 114 can be supported by the dielectric component 112. The conductive component 114 can be electrically coupled to the movable portion 110, which are both comprised of an electrically conductive material. The displacement member 108 and dielectric component 112 can be comprised of polysilicon, silicon dioxide, aluminum oxide, silicon nitride, polymer, or other structural/dielectric materials.

The movable portion 110 can be movable relative to the base 102 by deflection of the displacement member 108. In one example, the displacement member 108 can have a piezoelectric material, such as lead zirconate titanate (PZT), associated with the movable portion 110. The microelectromechanical device 100 can include a voltage source $V_1$ electrically coupled to the movable portion 110 and the biasing electrode 106. The voltage source $V_1$ can apply a biasing voltage to the movable portion 110 and the biasing electrode 106 to cause its deflection (displacement) toward the biasing electrode 106, thereby reducing the gap $G_1$ between the movable portion 110 and the biasing electrode 106.

In the example of FIG. 1, the displacement member 108 can have a pair of movable electrodes 116 (e.g., switch contacts) electrically coupled to each other, and the base 102 can have a pair of electrodes 118 (e.g., a switch) each electrically coupled to a circuit (not shown) such that the microelectromechanical device 100 can act as a switch for a variety of purposes. More specifically, when the voltage source $V_1$ applies a biasing voltage to the movable portion 110 and the biasing electrode 106, the movable portion 110 can deflect toward the biasing electrode 106 with sufficient voltage to bring into contact electrodes 116 to electrodes 118 to close a circuit, for instance. Alternatively, the biasing electrode 106 can apply a small biasing voltage sufficient to adjust sensitivity of the movable portion 110 to a corresponding stimulus (e.g. electromagnetic, sound, motion, etc). The biasing electrode 106, the movable portion 110, and the electrodes 116 and 118 can be comprised of any suitable electrically conductive material, such as but not limited to, doped polysilicon, metal, indium tin oxide, graphene and other two-dimensional conductors, conductive polymers, and the like.

In some cases, it is desirable to detect very small signals using the microelectromechanical device 100 for a variety of applications. Here, a particular voltage can be applied between the movable portion 110 and the biasing electrode 106 such that the gap G1 is reduced (but not reduced to the point that the electrodes 116 and 118 will contact each other, or to the point that the biasing electrode 106 and movable portion 110 are in contact). Thus, "further deflection" of the displacement member 108 can cause an increase in voltage across the piezoelectric material (i.e., the displacement member 108) and the biasing electrode 106 sufficient to pull the movable portion 110 into contact with the biasing electrode 106 (and/or to bring into contact the electrodes 116 and 118).

In one aspect of this "further deflection", the microelectromechanical device 100 can include a responsive element 120 supported by the movable portion 110 of the displacement member 108. Thus, the responsive element 120 can be configured to respond to a detectable characteristic to be sensed. The responsive element 120 can cause further deflection of the displacement member 108 in response to the detectable characteristic. In one aspect, the "further deflection" can induce a response signal that can be used to determine the amplitude and the frequency of the excitation causing the deflection (i.e., the response signal indicated by the movable portion 110 contacting the biasing electrode, and/or by the pairs of electrodes 116 and 118 contacting each other).

As non-limiting examples, the responsive element 116 can comprise: a magnet to sense magnetic fields; a charged layer to sense an electric field; a bi-metallic layer to sense temperature; a gas sensitive layer to sense different gases ($CO$, $CO_2$, $H_2$, etc.); a foot mass to sense vibrations; and bio-sensitive layers for detecting bio-hazardous and other gases; or a combination of such layers. As one example, assume the responsive element 120 of FIG. 1 is a permanent magnet. When subjected to an electromagnetic field, the permanent magnet can deflect downwardly (or upwardly, as desired for a particular application). When deflected downwardly, because the gap $G_1$ is already reduced by the aforementioned optional biasing voltage, a very small magnitude of an electromagnetic field can be sensed by virtue of the pairs of electrodes 116 and 118 clamping to each other to close a circuit upon the electromagnetic field acting on the permanent magnet (i.e., responsive element 120).

Figure 2:
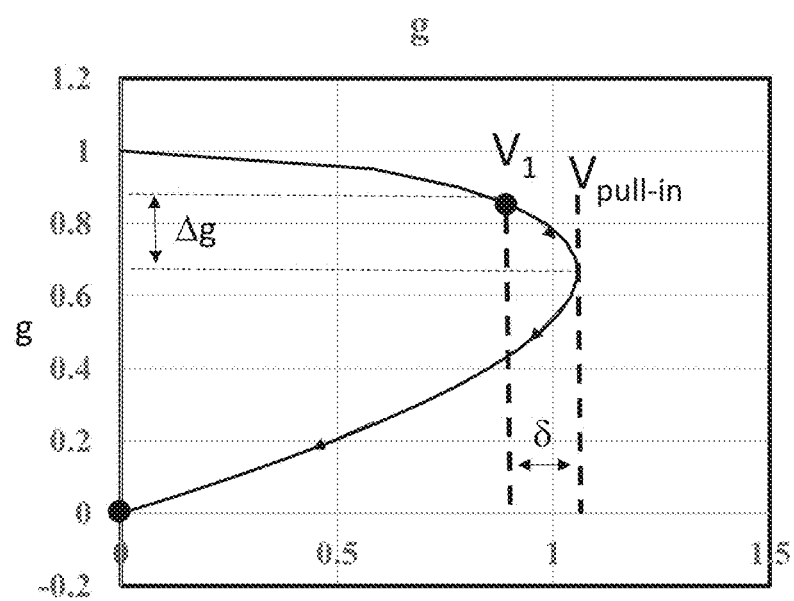
FIG. 2 is a graph of voltage versus gap distance of the microelectromechanical device of FIG. 1.

By designing the displacement member 108 to have a resting bias voltage $V_1$, when the displacement member 108 experiences movement from changes in a magnetic field, for example, the additional voltage (delta) may reach the pull-in voltage (V pull-in). At this point, as the distance of the gap $G_1$ is reduced, the capacitance dramatically increases as a function of 1/D (where D=the distance between 106 and 110, as 110 moves closer to 106). Once the movable portion 106 reaches a so-called "point of no return" at the V pull-in voltage, that the displacement member 108 clamps down to complete the circuit and provide a signal which can be recorded (and/or the switch is activated between electrodes 116 and 118). This is referred to as "thresholding" and is illustrated graphically in FIG. 2. This signal can be a fixed voltage response (i.e., threshold met) rather than a quantitative sensor like a change in voltage and/or current that can be measured. Once the displacement member 108 is pulled-in, the displacement member stays clamped, which can provide memory capabilities for the microelectromechanical device. This means that the displacement member 108 can remain in such clamped state for an indefinite period of time until the voltage $V_1$ is removed, for instance. Although bias voltage and pull-in thresholds can be a function of materials and configurations, as a general rule, bias voltage can be from about 0 to about 20 V, and the pull-in voltage can be from about 0.1 V to about 25 V in most exemplary devices.

The displacement member can be of any suitable configuration, such as a beam, a bridge, a plate or a diaphragm. When a beam is utilized, the beam can be supported in any suitable manner, such as a cantilevered beam fixed at a single end, a beam fixed at opposite ends, or a simply supported beam that may or may not be cantilevered at one end. In addition, the displacement member can be of any suitable size or dimension, such as a length from about 1 micrometer to about 1000 micrometer, a width from about 0.1 micrometer to about 500 micrometer, and a thickness from about 10 nanometers to about 2 micrometer.

In one aspect, the microelectromechanical device 100 can consume very low power, such as less than 10 nW of power, which makes the device suitable for many different security, remote sensing, and bio-implant applications.

In another aspect, the displacement member itself can be designed to resonate in response to acoustic vibrations or vibrations in the signal that is sensed. This can be achieved by variation of materials and physical dimensions of the displacement member to match particular resonant frequencies of the displacement member with the desired signal to be sensed. Regardless, the responsive element can be used to register changes in some property (e.g. magnetic field, electric field, movement, acoustic, etc.). For example, the responsive element can be a magnet (as exemplified above) and/or a charged dielectric to detect electric field, a suitable swell-able polymer to detect gases, or a weight to detect motion. Thus, the microelectromechanical device 100 can be configured as a sensor which is analog based.

Figure 3:
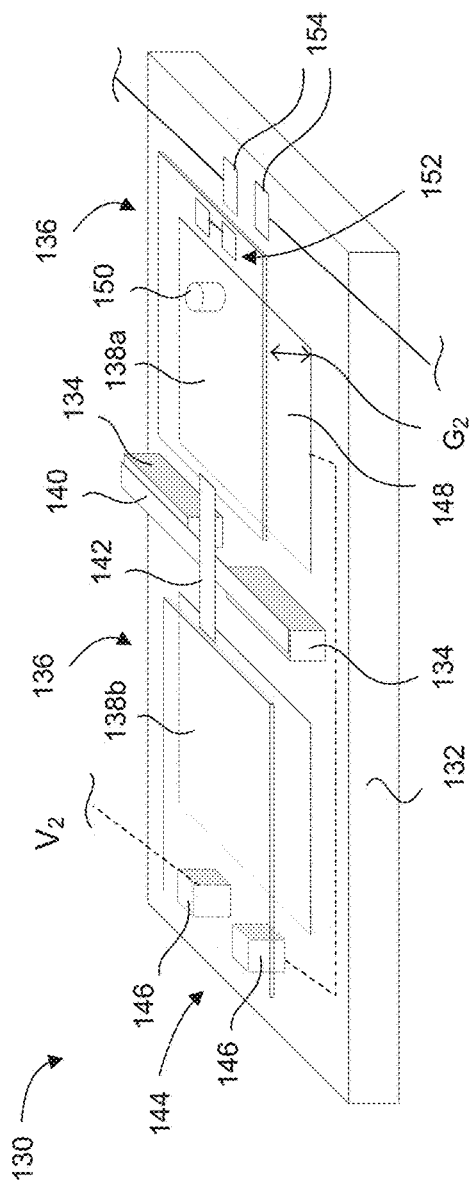
FIG. 3 illustrates a microelectromechanical device in accordance with another example of the present disclosure.

FIG. 3 illustrates a microelectromechanical device 130 in accordance with another example of the present disclosure. The microelectromechanical device 130 can comprise a base 132 and a pair of raised support structures 134 that have a gap there between (or it can be a single raised structure). In this case, a displacement member 136 comprises a first movable portion 138a and second movable portion 138b each extending from the raised support structures 134. Here, the first movable portion 138a and second movable portion 138b are opposing each other across the raised support structures 134.

In one aspect, the second movable portion 138b facilitates counterbalancing the first movable portion 138a. Although not specifically shown on FIG. 3, the first and second movable portions 138a and 138b can be electrically conductive material disposed on a dielectric material, much like as in FIG. 1. In one aspect, the displacement member 136 can be supported by the pair of raised support structures 134 via a torsion beam 140. The torsional beam 140 can extend laterally across the pair of raised support structures 134 and can be substantially perpendicularly coupled to a rigid support member 142 that couples the first movable portion 138a to the second movable portion 138b. The microelectromechanical device 130 can also include a switch 144 having terminals 146 of a circuit associated with the base 130 and a switch contact (not shown for clarity) associated with the second movable portion 138b (the "switch contact" can be similar to the electrodes 116 of FIG. 1). The circuit can include the voltage source $V_2$. The terminals 146 can be raised above the base 132 approximately the height of the raised support structures 134 such that the second movable portion 138b can rest upon (i.e., and be electrically coupled to) the terminals 146 of the switch 144.

Figure 4:
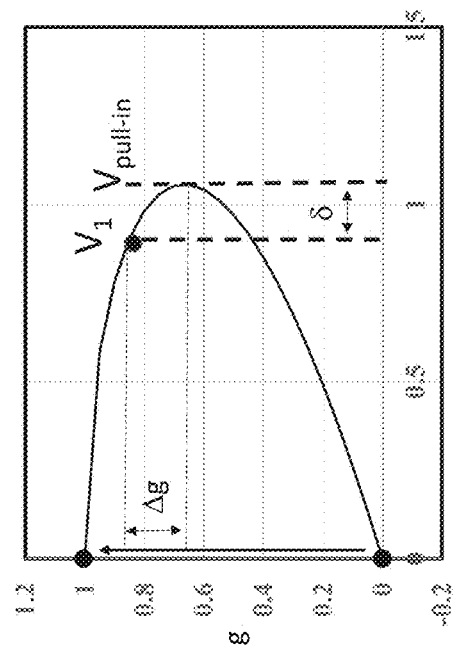
FIG. 4 is a graph of voltage versus gap distance of the microelectromechanical device of FIG. 3.

In operation, the first movable portion 138a can move towards a biasing electrode 148 (e.g., upon a voltage applied by V$_2$). As this happens, energy is stored in the torsional beam 140, and the switch 144 remains closed until such time that the first movable portion 138a contacts the biasing electrode 148 (as similarly discussed regarding FIG. 1 regarding the optional biasing voltage aspects). Once said contact occurs, the energy stored in the torsional beam 140 is released with sufficient force such that the switch 144 moves to an open configuration. That is, the second moveable portion 138b rotates upwardly, thereby separating its switch contacts (not shown) from the terminals 146 (similar rotational movement is also illustrated on FIG. 16B). Once the circuit is opened, the first movable portion 138a is electrically released (un-clamped) from the biasing electrode 148, and the second movable portion 138b tends to move/return toward its original resting position on the terminals 146. As a result, the switch contact (on 138b, not shown) comes into contact with the terminals 146 and closes the circuit, which can then re-apply the optional biasing voltage. This can then repeat the cycle of movement of the first and second movable portions, as discussed above. The microelectromechanical device 130 can provide thresholding as described regarding FIG. 1 but, in this case, without memory capabilities because once the first movable portion 138a is pulled-in, the switch 144 cuts off the voltage and the displacement member 136 resets to its original location, as illustrated graphically in FIG. 4.

Similarly as described with reference to FIG. 1, the microelectromechanical device 130 can comprise a responsive element, such as a permanent magnet 150 coupled to an end of the first movable portion 138a. A responsive element associated with the first movable portion 138a can facilitate said "further deflection", as further discussed herein. The first movable portion 138a can also have movable electrodes 152 and the base can have electrodes 154 that can be electrically coupled to the movable electrodes 152 (as a switch) during the V pull-in phase, as with FIG. 1.

The microelectromechanical device 130 of FIG. 3 can also be configured as a mechanical amplifier. For example, voltage V$_2$ can be chosen so that a small delta (g) results in the collapse of the gap G$_2$ between the first movable portion 138a and the biasing electrode 148. This can result in signal amplification in the same way that a small excitation can cause a large deflection in a bi-stable structure maintained at the verge of transition.

FIGS. 5, 6A and 6B illustrate a microelectromechanical device 160 in accordance with yet another example of the present disclosure. In this case, the microelectromechanical device 160 can be tuned (e.g., at the manufacturing stage). Generally, the microelectromechanical device 160 can have similar features as described regarding FIG. 1. One notable difference is that an end portion 162 (i.e., a distal tip area) of a displacement member 164 can be directionally re-directed (or interfered with) by a tuned support structure 166 on a base 168 upon applying an optional biasing voltage. As on FIG. 6B, the tuned support structure 166 can be shorter in height compared to the height of a raised support structure 170 of a base 168 such that the end portion 162 is spatially separated from the tuned support structure 166 (FIGS. 6A, showing an open circuit and a normal position of the displacement member 164). The response characteristics of the microelectromechanical device 160 to a constant voltage source V$_3$ can be tuned by selectively attaching the tuned support structure 166 laterally along the base 168 relative to the end portion 162 at a predefined location for purposes of tuning the microelectromechanical device 160 for a particular application.

For example, a distance L1 between the raised support structure 170 and movable electrodes 172 can be selected for a particular purpose, such as sensing particular electromagnetic field utilizing a response element 174 (e.g., a permanent magnet; see FIG. 1 discussion). Likewise, a distance L2 between the movable electrodes 172 and the tuned support structure 166 can be selected for a particular purpose corresponding to the purpose of the selecting the distance L1 (e.g., sensing an electromagnetic field).

Thus, during manufacturing, the tuned support structure 166 can be installed at a predefined location for a predefined purpose (along with the selection of the size, thickness, material, etc. of the displacement member 164 and its movable portion 176). As illustrated on FIGS. 6A (open circuit) and 6B (closed circuit), when the voltage V$_3$ is applied to a biasing electrode 178 (FIG. 5) and the movable portion 176, a gap G$_3$ is reduced. Further deflection (e.g., via an electromagnetic field acting on response element 174) causes the movable electrodes 172 to clamp/contact electrodes 180 (on base 168) to close a circuit.

Notably, as illustrated on FIG. 6B, the end portion 162 remains vertically supported by the tuned support structure 166 to limit deflection of the displacement member 164. Thus, the predefined location of the tuned support structure 166 corresponds to the amount of deflection limited for a particular purpose. One benefit of this ability to tune the microelectromechanical device 160 is that slight variations that may occur during manufacture that can impact the dimensions of the displacement member 164 can be accommodated by adjusting the position of the tuned support structure 166. Therefore, the microelectromechanical device 160 can be tuned by simply moving the support component 166 during manufacture instead of adjusting the voltage provided by the voltage source, if adjusting the voltage source is not desirable.

This tuning can also be achieved with a plurality of microelectromechanical devices coupled in parallel where each device has a tuned support structure (e.g., 166) positioned at different locations along their respective bases. Thus, a particular microelectromechanical device can be selected (based on the location of its support component) and a voltage can be applied to that device for a particular purpose and desired sensitivity of a response element being sensed.

FIGS. 7, 8A, and 8B illustrate a microelectromechanical device 200 in accordance with still another example of the present disclosure. This example is similar to the example of FIGS. 5-6B (in structure and some functions), but in this case a middle portion 202 of a displacement member 204 is supported such that vertical deflection of a displacement member 204 is limited. Thus, a tuned support structure 206 can be supported about the base and can be shorter than a raised support structure, like with FIG. 6B. The middle portion 202 is adjacent the tuned support structure 206. In this configuration the displacement member 204 has two portions of different lengths (L$_3$ and L$_4$). The resonant frequency of the total length (L$_3$ and L$_4$) is denoted by $\omega_T$. The resonant frequency of segments L$_3$ and L$_4$ are respectively denoted by $\omega_3$ and $\omega_4$. It can be shown that the resonant frequency is given by square root of the ratio of the effective spring constant of the deformable structure and its effective mass. The device shown in FIGS. 7, 8A, and 8B act as signal filters and respond to the different frequency components in the signal. In FIG. 7 the device has two different segments that enables it to respond to three different frequencies. The lowest resonant frequency occurs at a frequency corresponding to the whole beam vibrating. If this lowest frequency signal ($\omega_T$) is applied to the device, the beam will be set into vibrations and it may contact the 206 post. Upon contacting this post, the beam effectively develops two more resonances ($\omega_3$ and $\omega_4$) corresponding to the two effective sections with L2 and L4 lengths. Thus, if a signal has all three frequencies of $\omega_T$, $\omega_3$ and $\omega_4$, the deformable structure also having these resonant frequencies will resonate with the signal and the amplitude of its response will depend on the strength of the signal in corresponding frequency components. Thus, sensors can be formed that provide an output when all the three frequency components are present with sufficient strength.

Figure 9:
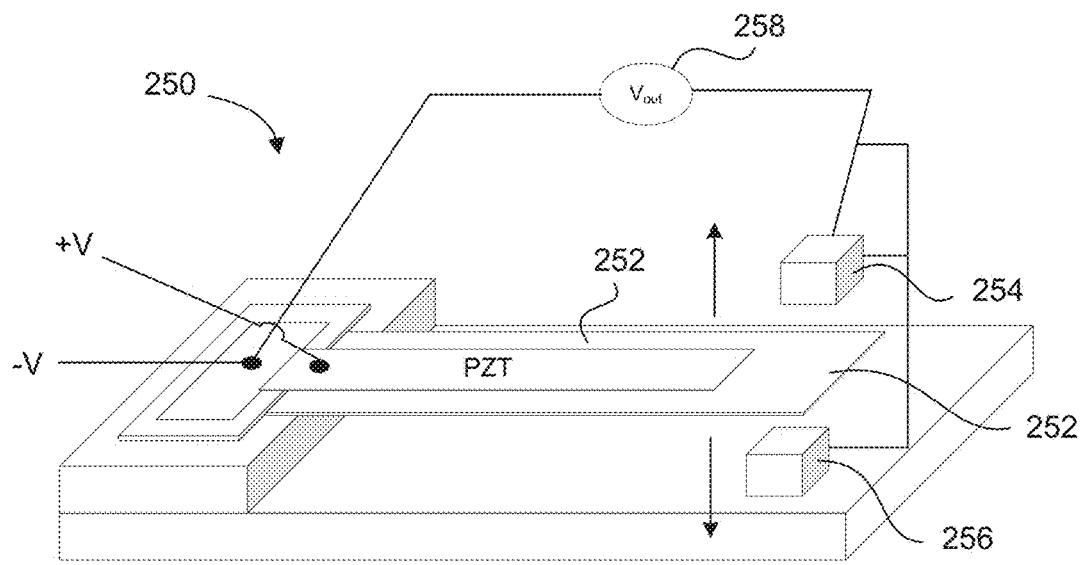
FIG. 9 illustrates a microelectromechanical device configured as a mechanical rectifier in accordance with an example of the present disclosure.
Figure 10:
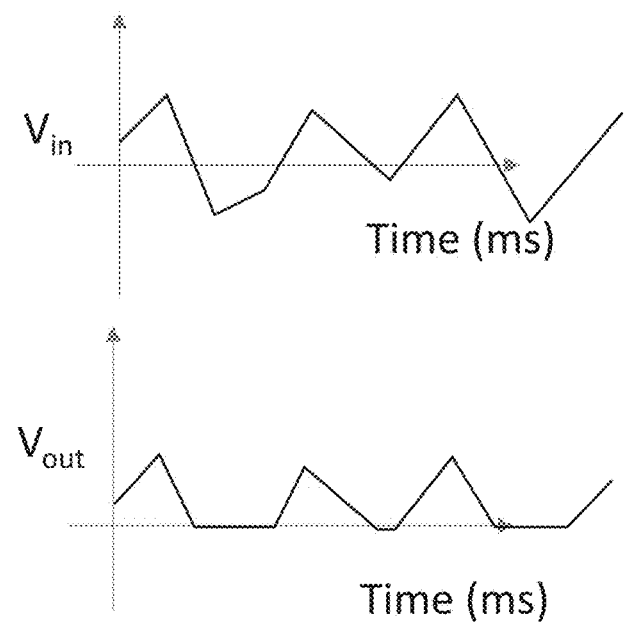
FIG. 10 is a set of graphs showing rectification resulting from the device of FIG. 9.

FIG. 9 illustrates a microelectromechanical device 250 configured as a mechanical rectifier in accordance with an example of the present disclosure. In this device, an end of a displacement member 252 contacts top and bottom electrodes 254 and 256, respectively, sequentially and that are connected to "add" up the positive and negative signals produced by a piezoresistive layer in the displacement member 252. The top electrode 256 can be coupled to a voltage source ($V_{out}$) 258 (having a circuit connected to bottom electrode 256). Both electrodes 254 and 256 can be separately electrically coupled to a circuit. The constructive addition of the signal results in the rectification of the excitation that causes the deformable part to vibrate. In this way, when the displacement member 252 moves up (upon applied +/− voltage) it contacts the top electrode 254, and when it moves down (upon applied −/+ voltage) it contacts the bottom electrode 256. In one example, assume you have a certain amount of charge on the displacement member 252, so when it oscillates between the top and bottom electrodes 254 and 256, a charge is transferred to each electrode upon contact. This device can be used to generate AC signals and/or perform half- or full-wave rectification. FIG. 10 shows a set of graphs comparing $V_{in}$ and $V_{out}$ for the example of FIG. 9 which illustrates rectification of the input voltage.

Alternatively, the microelectromechanical device 250 can act as a charge coupled device. In this manner, if the top electrode 254 is coupled to a battery source, when the displacement member 252 contacts the top electrode, it gets a certain charge from the battery source. And, then when the charge of the displacement member 252 has an equal charge to that of the top electrode 254, the displacement member 252 is released and its built-up potential energy causes it to oscillate downwardly until it contacts the bottom electrode 256. Upon such contact, the charge held by the displacement member 252 can be transferred to the bottom electrode 256 (i.e., in a way that "trickles" the charge from the battery source to another source). This acts as a type of switched capacitor filter or regulator for a variety of applications.

Figure 11:
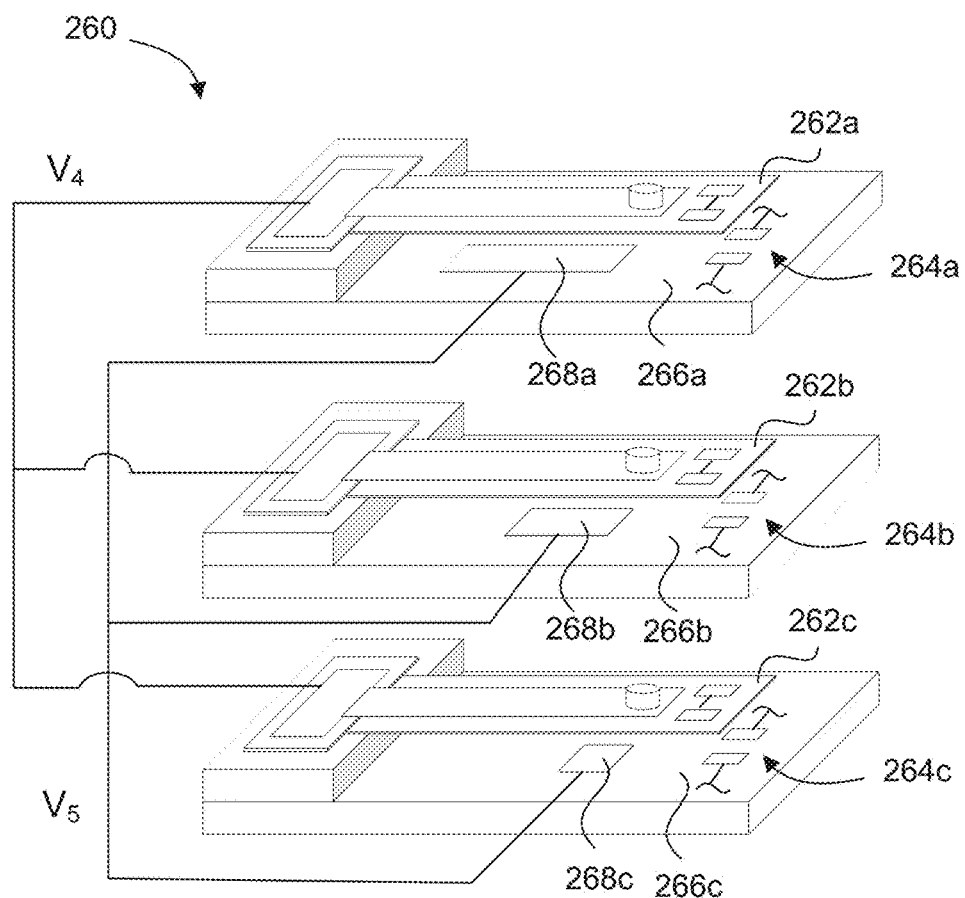
FIG. 11 illustrates a microelectromechanical device configured as an analog to digital converter in accordance with an example of the present disclosure.
Figure 12:
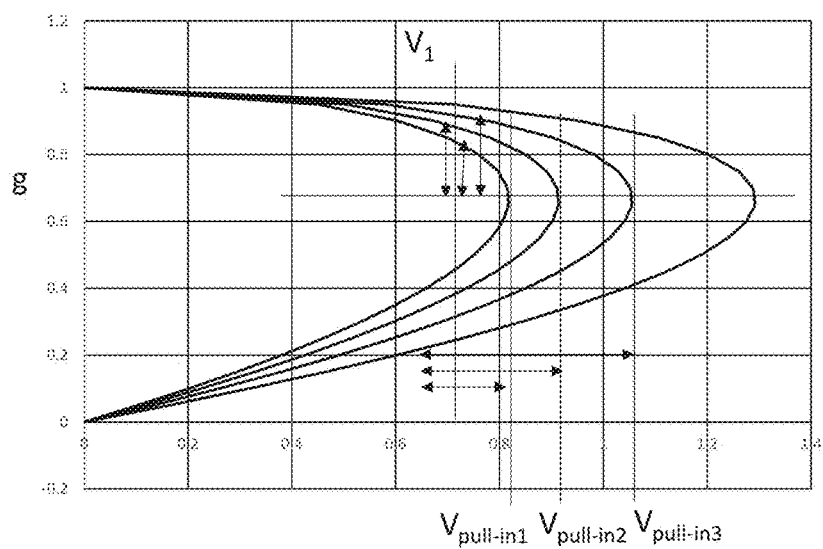
FIG. 12 is a graph of voltage versus gap distance of the microelectromechanical device of FIG. 11.

FIG. 11 illustrates a microelectromechanical device 260 configured as an analog to digital converter in accordance with an example of the present disclosure. In this example, the microelectromechanical device 260 can include a plurality or an array of displacement members 262a, 262b, and 262c, and a plurality of switches 264a, 264b, and 264c corresponding to electrodes of respective displacement members 262a, 262b, and 262c. In addition, the microelectromechanical device 206 can include a plurality of base portions 266a, 266b, and 266c, where at least one of the base portions 266a, 266b, and 266c is associated with at least one displacement member 262a, 262b, and 262c. Each base portion can comprise a biasing electrode 282a, 282b, and 282c that may be different lengths, thickness, material, etc. such that each displacement member associated with a respective biasing electrode can move a different sensitivity levels to a voltage ($V_4$ or $V_5$) and/or a further deflection via a corresponding response element (e.g., a permanent magnet) to close a circuit via a respective switch (i.e., 264a, 264b, and 264c). In this way, the microelectromechanical device 260 can provide thresholding and memory capabilities as described above, which is illustrated graphically in FIG. 12. Such an array can be useful to increase reliability (i.e. redundancy), allow variation of the responsive element and/or displacement members to be responsive to different stimulus across the array, and to perform spectrum analysis (like a filter with different band-pass frequency components) on the excitation signal.

Figure 13:
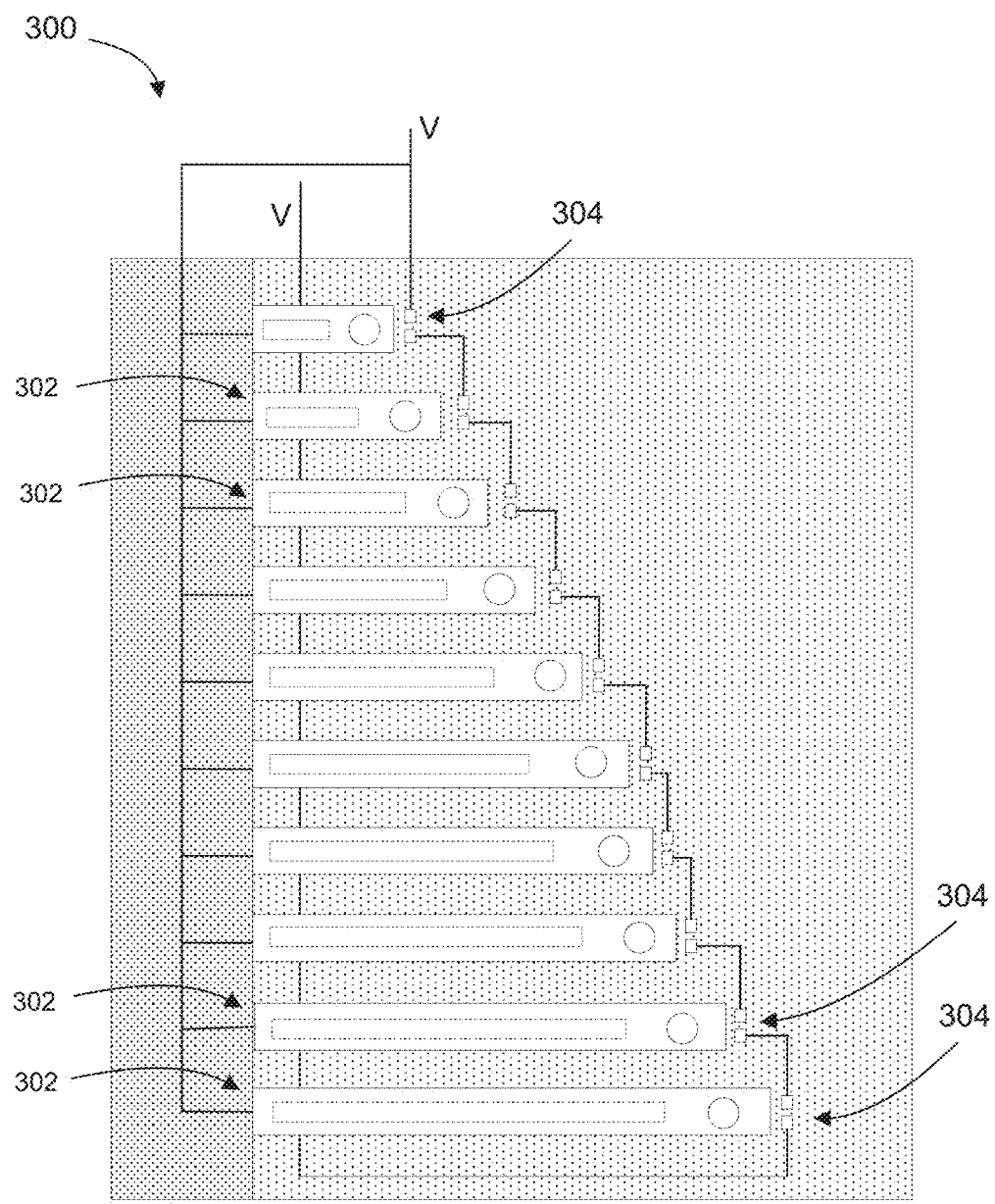
FIGS. 13 and 14 illustrate microelectromechanical devices configured for performing Boolean operations in accordance with an example of the present disclosure.
Figure 14:
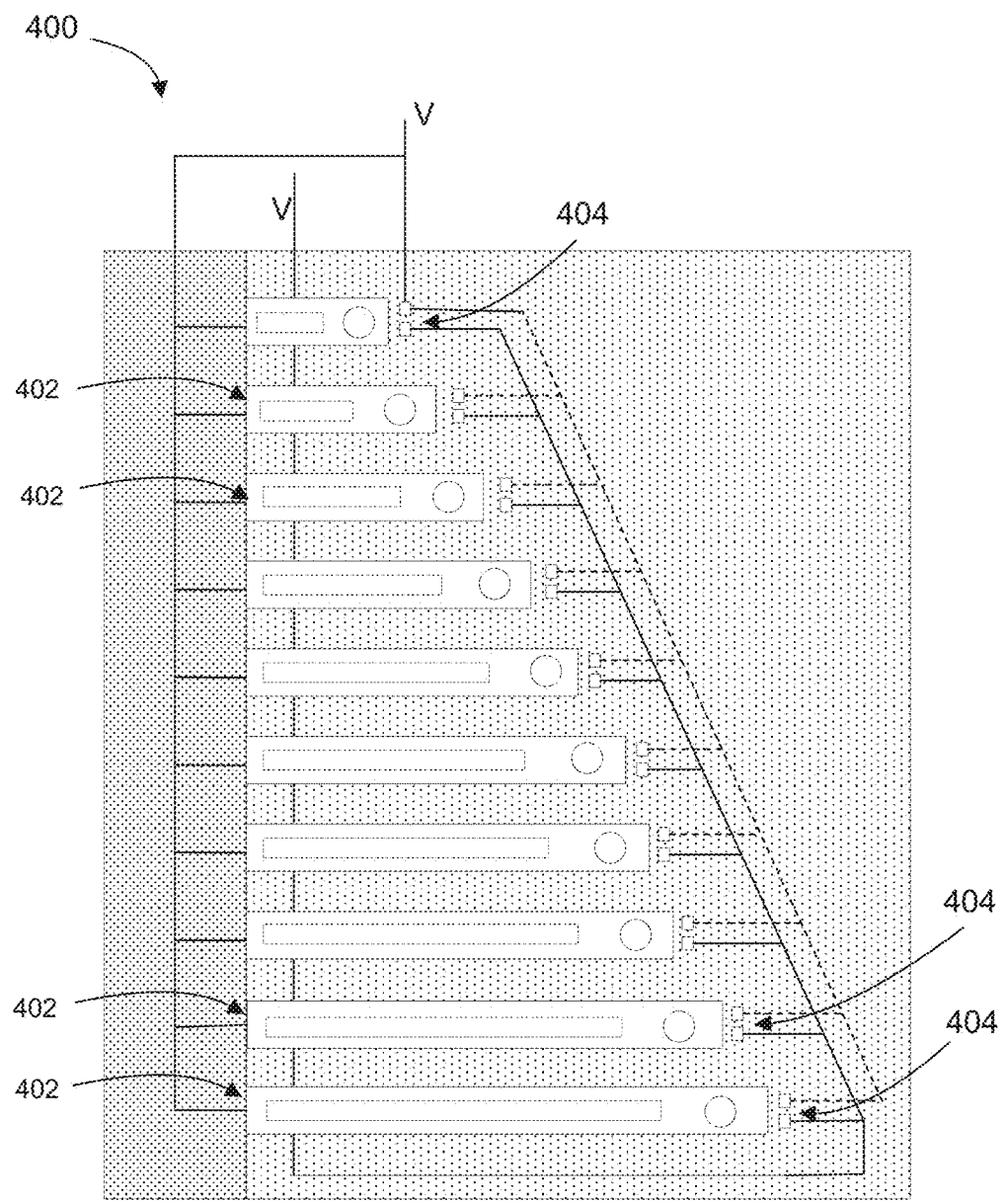

FIGS. 13 and 14 are top schematic views of two Boolean operation systems that each comprise a microelectromechanical device configured for performing Boolean operations in accordance with an example of the present disclosure. For instance, FIG. 13 comprises a microelectromechanical device 300 that can provide thresholding, which can be utilized to perform Boolean operations. In particular, the system 300 includes a plurality of displacement members 302 electrically coupled in series to perform an "AND" operation. Likewise, FIG. 14 comprises a microelectromechanical devices 400 and a plurality of displacement members 402 (e.g., switches) electrically coupled in parallel to perform an "OR" operation. For purposes of illustration clarity, FIGS. 13 and 14 only show pairs of electrodes (304 and 404; associated with respective bases), and such electrodes are drawn off-set to the right from ends of respective displacement members (also, electrodes on the displacement members are not shown here for purposes of clarity). Responsive elements (the circles on FIGS. 13 and 14) can also be positioned at ends of each displacement member 302, for similar purposes of pull-in Voltage operations as discussed herein.

Each displacement member of the microelectromechanical devices (300 and 400) can be configured to have different acoustic resonant frequencies (e.g. by having different lengths, widths, thicknesses, mass, length/size of movable member (dashed lines), etc.), thus providing the ability to mechanically perform spectral analysis. The microelectromechanical devices can therefore serve as sensors which are selective for specific response frequencies. For example, each displacement member (302 and 402) would be responsive to magnetic fields at differing frequencies (i.e. frequency response is a function of the length, width and material of the beam). Similar variations in the responsive elements can be made to sense electric fields, forces, and the like as previously described. Thus, "AND"/"OR" Boolean type operations can be accomplished. For example, in the AND operation (FIG. 13), if a signal with all the frequency components that are present in the displacement members 302 is applied to the device 300, it will cause all the resonators to vibrate and touch the bottom electrode producing a signal at the output circuit. If any of the frequency components are absent in the excitation signal, then the corresponding resonator will be excited and the output of the device will be zero. The OR device (FIG. 14) will produce an output signal if the excitation signal has any of the frequency components presented by the resonators. Likewise, other Boolean operations such as NOT, NAND, XNOR, and XOR can also be realized using these principles.

FIG. 15 shows a top view of a microelectromechanical device 500 in accordance with another example of the present disclosure. The microelectromechanical device 500 of this example includes a plurality of displacement members 502 that have counterbalances to cancel the effect of vibrations. For example, each displacement member 502 can be an elongated member supported by a raised support structure 504 such that positions opposing ends of each displacement member 502 above a base 506 (effectively forming two displacement ends for each displacement member). Here, each displacement member 502 can have a responsive element 508 (e.g., a magnet) on a left end, and the opposing right end can have a mass 510 (e.g., aluminum) thereon. Thus, each displacement member 502 can be counterbalanced by said masses 510. Optionally, the displacement members 502 can have differential geometries (i.e., varied lengths, widths, thicknesses, etc). The counter-balancing (e.g., magnets counterbalanced by masses) along with coupling of different sensor elements enables the sensor system to reject unwanted excitations such as vibrations when sensing the magnetic field or other excitations in the presence of an environmental parasitic signal. It also increases the sensitivity of the sensor system in detecting its intended signal.

Figure 16A:
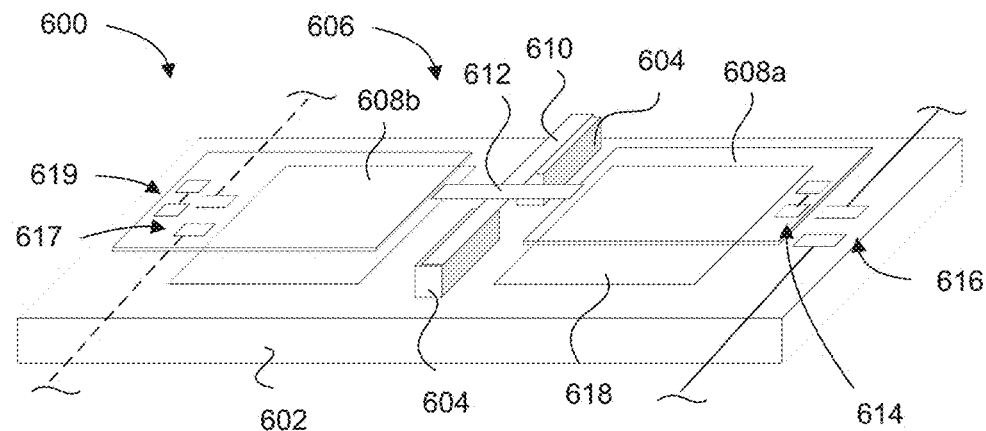
FIGS. 16A-16C illustrate a microelectromechanical device in accordance with another example of the present disclosure.
Figure 16B:
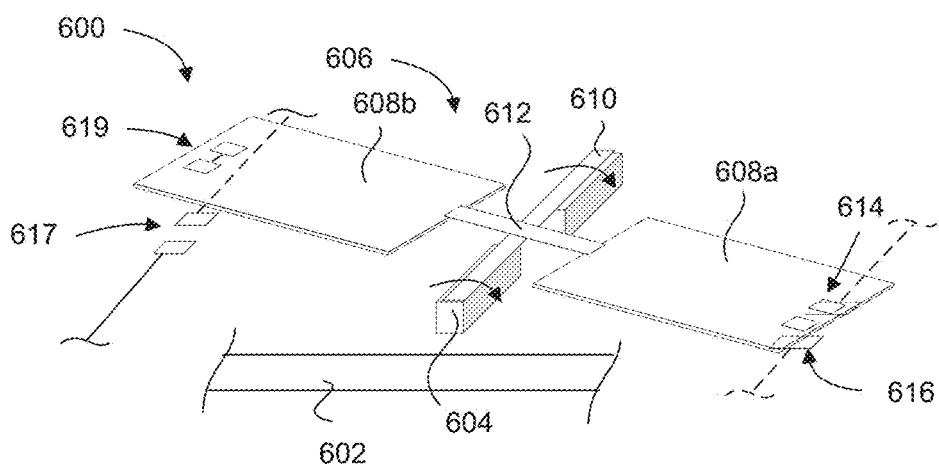
Figure 16C:
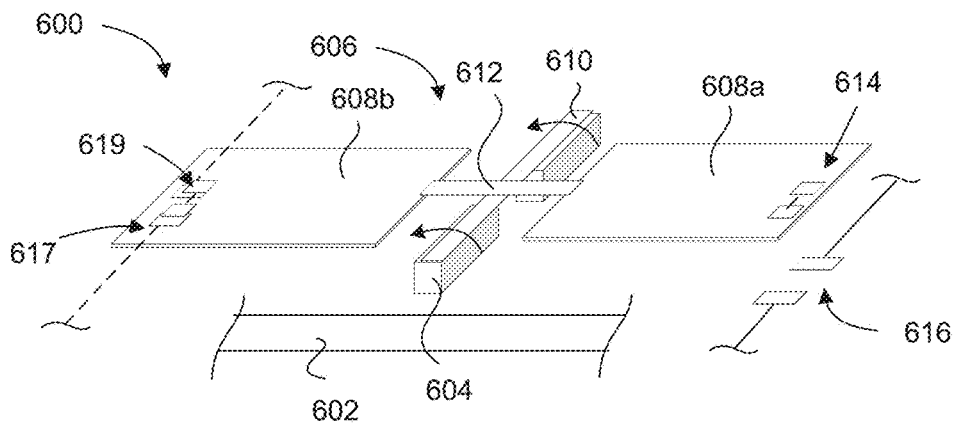

FIGS. 16A-16C illustrate a microelectromechanical device 600 in accordance with another example of the present disclosure that can take advantage of adiabatic transitions and available thermal energy. The microelectromechanical device 600 of this example is similar in structure to FIG. 3. However, one notable difference is that the microelectromechanical device 600 does not include raised terminals (i.e., 146 of FIG. 3). More specifically, the microelectromechanical device 600 can comprise a base 602 and a pair of raised support structures 604 that have a gap there between (or it can be a single raised structure). In this case, a displacement member 606 comprises a first movable portion 608a and second movable portion 608b each extending from the raised support structures 604. Here, the first movable portion 608a and second movable portion 608b are opposing each other across the raised support structures 604.

The second movable portion 608b facilitates counterbalancing the first movable portion 608a. In one aspect, the displacement member 606 can be supported by the pair of raised support structures 604 via a torsional beam 610. The torsional beam 610 can extend laterally across the pair of raised support structures 604 and can be perpendicularly coupled to a rigid support member 612 that couples the first movable portion 608a to the second movable portion 608b. The microelectromechanical device 600 can also include a pair of electrodes 616 of a circuit associated with the base 602 and a switch contact 614 associated with the first movable portion 608a. Similarly, a pair of electrodes 617 on the other end of the base 602 are positioned to correspond to a switch contact 619 on the second movable portion 608b. These switch contacts can be similar to the electrodes 116 of FIG. 1.

In one operation, and as illustrated on FIG. 16B, the first movable portion 608a can move towards a biasing electrode 618 (e.g., upon an applied voltage, such as shown and described regarding FIG. 3). As this happens, energy is stored in the torsion beam 610 as first movable portion 608a contacts the biasing electrode 618 (as similarly discussed regarding FIG. 1). As said contact occurs, the second moveable portion 608b can rotate upwardly (FIG. 16B) corresponding to the distance moved of the first moveable portion 608a. Upon removing said voltage, the first movable portion 608a is released from contact between electrodes 616 and switch contacts 614, and the energy stored in the torsional beam 610 is released. This energy causes the left movable portion 608b to move downwardly to the left (i.e., towards the electrodes 617) (FIG. 16C). Thus, a biasing voltage may not be needed (or a very small voltage is needed) to move the second movable portion 608b into contact with electrodes 617. Therefore, considerable less external energy is required to move the second movable portion 608b as compared to the energy required to move the first movable portion 608b ("external" meaning energy not transferred by the torsional beam 610).

The effect of such energy dissipation mechanisms are usually expressed as the quality factor that is proportional to ratio of the stored energy and the energy dissipated per cycle of switching. For a quality factor of 100, the energy dissipated per cycle can be approximately 6% of the stored energy. So, the amount of work needed to deflect the second movable portion 608b upon the release of the first movable portion 608a is only about 0.06 times the original work that is needed to deflect the first movable portion 608a from its equilibrium position (FIG. 16A). This is called adiabatic switching with an energy recovery mechanism (e.g., the torsional beam). Computational adiabatic switches and circuits can have at least 75-80 percent less energy consumption than switches that do not have such energy recovery mechanism.

Similarly as described with reference to FIG. 1, the microelectromechanical device 600 can comprise a responsive element, such as a permanent magnet, coupled to an end of the first and/or second movable portion. The microelectromechanical device 600 can also be configured as a mechanical amplifier. For example, a voltage can be chosen so that a small delta (g) results in the collapse of the gap between the first movable portion 608a and the biasing electrode 618. This can result in signal amplification in the same way that a small excitation can cause a large deflection in a bi-stable structure maintained at the verge of transition.

Anther actuation technique (of displacement members herein) is based on thermal actuation that usually require large power compared to electrostatic or piezoelectric techniques. There are also chemical actuation techniques based on oxidation/reduction in certain class of materials. Chemical actuation techniques tend to be slower.

It is also possible to actuate microelectromechanical and other mechanical devices using phase transformation in certain materials that can be triggered using light, heat, electric current, and mechanical deformations. In some of these materials a sharp change in the material's electromagnetic properties occurs as a result their phase changes. One such material is family of vanadium oxides.

The principles disclosed herein can therefore be used to create microelectromechanical devices designed to sense very low magnetic fields (~0.1 pT), small vibrations, to perform amplification, logical operations (e.g., AND/OR), spectral analysis, analog to digital conversion, rectification (zero-volt turn-on voltage), detection of RF signals (e.g., −100 dBm), and/or amplification (e.g., 100× at 100 MHz) using less than 10 nW of power.

In one specific example, the microelectromechanical devices can be used to map, monitor, measure or otherwise characterize brain signals. Such devices may be placed in a non-intrusive manner outside on the scalp (to perform magnetoencephalography or MEG) or directly adjacent the brain tissue inside the skull for sensing nearby neuron activities through their electric discharge.

The foregoing detailed description describes the invention with reference to specific exemplary embodiments. However, it will be appreciated that various modifications and changes can be made without departing from the scope of the present invention as set forth in the appended claims. The detailed description and accompanying drawings are to be regarded as merely illustrative, rather than as restrictive, and all such modifications or changes, if any, are intended to fall within the scope of the present invention as described and set forth herein.

What is claimed is:

1. A microelectromechanical device, comprising:
   a base having a raised support structure;
   a displacement member supported by the raised support structure, the displacement member having
      a movable portion extending from the raised support structure, the movable portion being movable relative to the base by deflection of the displacement member, and
      a piezoelectric material associated with the movable portion;
   a responsive element supported by the movable portion of the displacement member, the responsive element being configured to respond to a detectable characteristic to be sensed, wherein the responsive element causes deflection of the displacement member in response to the detectable characteristic, said deflection inducing a response signal;
   a voltage source electrically coupled to the piezoelectric material; and
   a switch having terminals of a circuit associated with the base and a switch contact associated with the displacement member, wherein the switch contact comes into contact with the terminals and closes the circuit under the deflection, and the circuit is external to the microelectromechanical device,
   wherein structural properties of the displacement member including a length, a width and a material are selected to target a defined resonant frequency of the displacement member.

2. The microelectromechanical device of claim 1, wherein the responsive element comprises at least one of a magnet, a charged layer, a bi-metallic layer, a gas sensitive layer, a foot mass, and bio-sensitive layers.

3. The microelectromechanical device of claim 1, wherein the switch contact comes into contact with the terminals and closes the circuit when the movable portion contacts a biasing electrode.

4. The microelectromechanical device of claim 1, wherein the displacement member comprises a plurality of displacement members.

5. The microelectromechanical device of claim 4, wherein the switch comprises a plurality of switches corresponding to respective displacement members.

6. The microelectromechanical device of claim 5, wherein the plurality of switches are electrically coupled in series.

7. The microelectromechanical device of claim 5, wherein the plurality of switches are electrically coupled in parallel.

8. The microelectromechanical device of claim 4, wherein at least two of the plurality of displacement members have different acoustic resonant frequencies.

9. The microelectromechanical device of claim 1, wherein the displacement member comprises a second movable portion extending from the raised support structure opposite the first movable portion.

10. The microelectromechanical device of claim 9, wherein the second movable portion facilitates counterbalancing the first movable portion.

11. The microelectromechanical device of claim 9, further comprising a switch contact associated with the second movable portion.

12. The microelectromechanical device of claim 11, wherein the circuit comprises the voltage source, wherein the switch contact separates from the terminals and opens the circuit as the first movable portion contacts a biasing electrode, thereby facilitating movement of the first movable portion away from the biasing electrode, and wherein the switch contact comes into contact with the terminals and closes the circuit to apply a biasing voltage.

13. The microelectromechanical device of claim 1, wherein the displacement member comprises a second movable portion extending from the raised support structure opposite the first movable portion.

14. The microelectromechanical device of claim 13, further comprising an energy recovery mechanism operatively coupled between the first movable portion and the second movable portion, wherein as the first movable portion contacts a biasing electrode the energy recovery mechanism stores energy.

15. The microelectromechanical device of claim 14, wherein the energy recovery mechanism comprises a torsional beam positioned about the raised support structure and coupled to each of the first and second movable portions, wherein upon removing a biasing voltage the torsional beam releases stored energy that causes the second movable portion to move and contact the switch contact to contact the pair of electrodes to close a circuit.

16. The microelectromechanical device of claim 1, wherein the base comprises a plurality of base portions, and wherein at least one of the base portions is associated with at least one displacement member.

17. The microelectromechanical device of claim 1, wherein the displacement member is supported by the raised support structure via a torsion beam.

18. The microelectromechanical device of claim 1, wherein the displacement member comprises a beam fixed only at one end (cantilever).

19. The microelectromechanical device of claim 1, wherein the displacement member comprises a beam fixed at opposite ends.

20. The microelectromechanical device of claim 1, wherein the displacement member comprises a diaphragm.

21. The microelectromechanical device of claim 1, wherein the piezoelectric material comprises lead zirconate titanate (PZT).

22. The microelectromechanical device of claim 1, wherein the microelectromechanical device is configured as at least one of a mechanical amplifier, a mechanical rectifier, an analog-to-digital converter, and a sensor.

23. The microelectromechanical device of claim 1, further comprising:
   a biasing electrode supported by the base,
   wherein the moveable portion is extended from the raised support structure and spaced from the biasing electrode by a gap,
   wherein the voltage source is electrically coupled to the piezoelectric material and the biasing electrode,
   wherein the voltage source applies a biasing voltage to the piezoelectric material and the biasing electrode to cause deflection of the displacement member toward the biasing electrode thereby reducing the gap between the movable portion and the biasing electrode, and
   wherein further deflection of the displacement member causes an increase in voltage across the piezoelectric material and the biasing electrode sufficient to pull the movable portion into contact with the biasing electrode.

24. A microelectromechanical device, comprising:
   a base having a raised support structure;

a displacement member supported by the raised support structure, the displacement member having
   a first movable portion extending from the raised support structure, the first movable portion being movable relative to the base by deflection of the displacement member, and
   a piezoelectric material associated with the first movable portion;

a biasing electrode supported by the base;

a voltage source electrically coupled to the piezoelectric material; and a switch having terminals of a circuit associated with the base and a switch contact associated with the displacement member, wherein the switch contact comes into contact with the terminals and closes the circuit under the deflection, and the circuit is external to the microelectromechanical device, wherein structural properties of the displacement member including a length, a width and a material are selected to target a defined resonant frequency of the displacement member, wherein the moveable portion is extended from the raised support structure and spaced from the biasing electrode by a gap, wherein the voltage source is electrically coupled to the piezoelectric material and the biasing electrode, wherein the voltage source applies a biasing voltage to the piezoelectric material and the biasing electrode to cause deflection of the displacement member toward the biasing electrode thereby reducing the gap between the movable portion and the biasing electrode, and wherein further deflection of the displacement member causes an increase in voltage across the piezoelectric material and the biasing electrode sufficient to pull the movable portion into contact with the biasing electrode.

25. The microelectromechanical device of claim 24, further comprising a responsive element supported by the movable portion of the displacement member, the responsive element being configured to respond to a detectable characteristic to be sensed, wherein the responsive element causes deflection of the displacement member in response to the detectable characteristic, said deflection inducing a response signal.

26. The microelectromechanical device of claim 24, wherein the switch contact comes into contact with the terminals and closes the circuit when the movable portion contacts a biasing electrode.

27. The microelectromechanical device of claim 24, wherein the displacement member comprises a second movable portion extending from the raised support structure opposite the first movable portion and the second movable portion facilitates counterbalancing the first movable portion.

* * * * *